US006329834B1

United States Patent
Krasnansky

(10) Patent No.: US 6,329,834 B1
(45) Date of Patent: Dec. 11, 2001

(54) REDUCTION OF SWITCHING NOISE IN INTEGRATED CIRCUITS

(75) Inventor: Keith Krasnansky, Germantown, MD (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/475,983

(22) Filed: Dec. 30, 1999

(51) Int. Cl.[7] .................. H03K 17/16; H03K 19/003
(52) U.S. Cl. .................. 326/26; 326/21; 326/27
(58) Field of Search .................. 326/17, 26–27, 326/83, 121, 68, 80–81

(56) References Cited

U.S. PATENT DOCUMENTS

| | | | | |
|---|---|---|---|---|
| 4,933,574 | * | 6/1990 | Lien et al. .................. | 326/84 |
| 5,124,579 | * | 6/1992 | Naghshineh .................. | 326/27 |
| 5,148,048 | * | 9/1992 | Kawasaki et al. .................. | 326/26 |
| 5,148,056 | * | 9/1992 | Glass et al. .................. | 326/87 |
| 5,319,260 | * | 6/1994 | Wanlass .................. | 326/26 |
| 5,723,986 | * | 3/1998 | Nakashiro et al. .................. | 326/80 |
| 5,973,512 | * | 10/1999 | Baker .................. | 326/17 |

FOREIGN PATENT DOCUMENTS

405191257 * 7/1993 (JP) .................. 326/121

* cited by examiner

Primary Examiner—Michael Tokar
Assistant Examiner—Steven S. Paik
(74) Attorney, Agent, or Firm—Warren L. Franz; Wade James Brady III; Frederick J. Telecky, Jr.

(57) ABSTRACT

An approach to reduce noise associated with ground bounce in integrated circuits containing CMOS gates and drivers is provided. Typical CMOS gates and drivers consist of complementary pairs of MOS gates. As the CMOS driver input transitions from high to low or low to high, there is a brief period during which both gates of a CMOS are conductive. When both gates are on, voltage and/or current spikes can occur from a variety of sources, including parasitic inductance between the gate and its external power supply. Disruptions, bounces, and sinks in voltage and/or current can create noise which can be propagated throughout a chip, potentially resulting in operational errors. The present invention adds a high and low reference voltage and two or more pairs of CMOS gates to each gate's circuit to dynamically add charge and/or draw charge from the CMOS gate as needed to reduce ground bounce and noise.

11 Claims, 2 Drawing Sheets

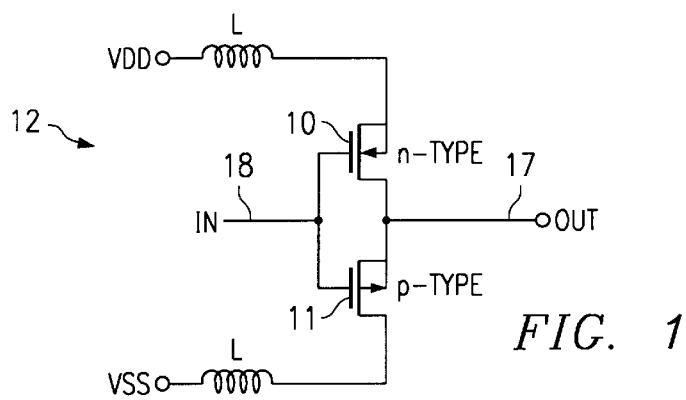
FIG. 1
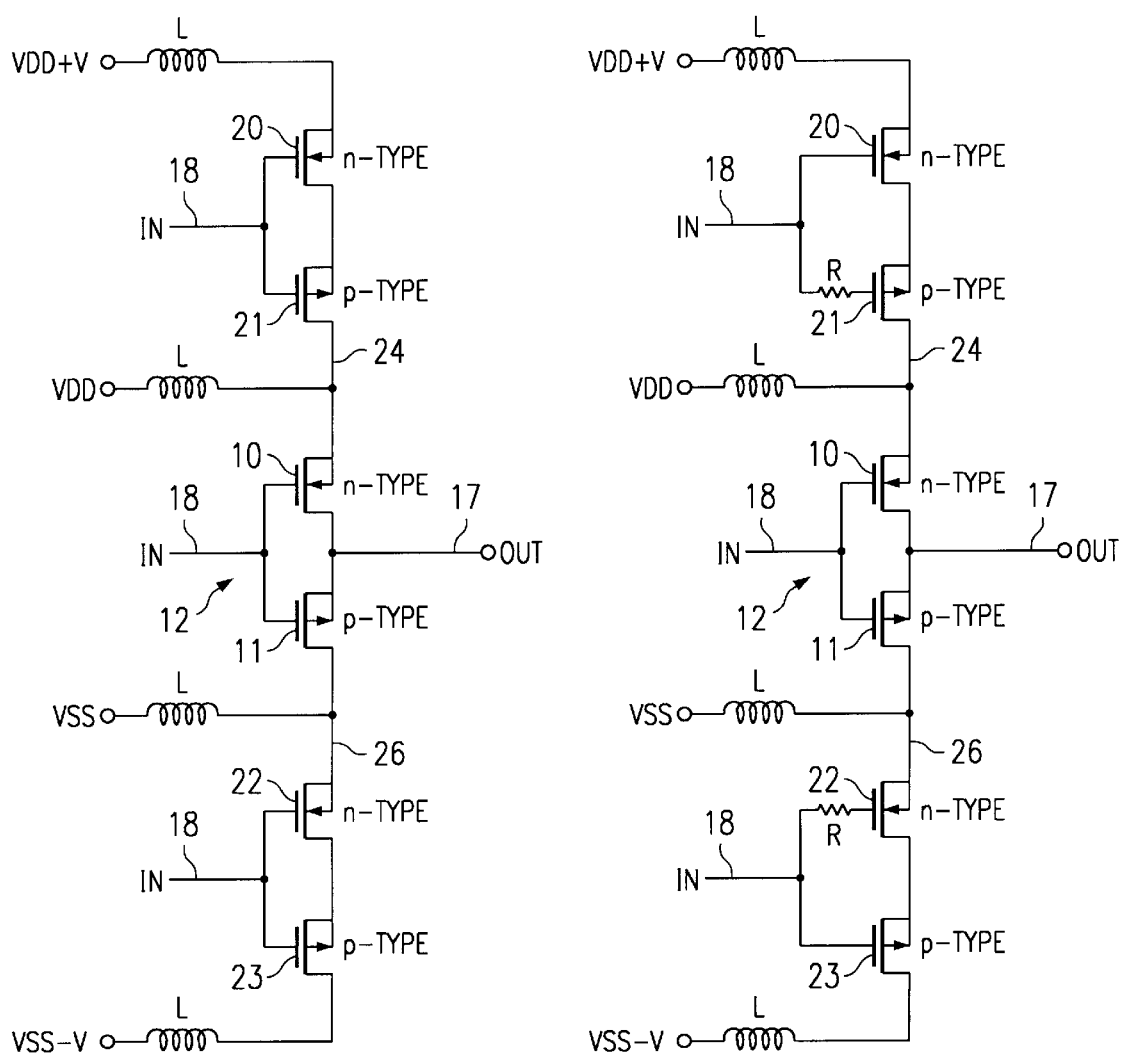
FIG. 2
FIG. 3

REDUCTION OF SWITCHING NOISE IN INTEGRATED CIRCUITS

BACKGROUND OF THE INVENTION

The present invention relates to the reduction of switching noise in CMOS gates and drivers.

Typical CMOS gates and drivers consist of a complementary pair of MOS gates, one n-type 10 and one p-type 11, as illustrated in FIG. 1. Gate 11 is connected to input 18, output 17, and low voltage source VSS. Gate 10 is connected to input 18, output 17, and high voltage source VDD. When input 18 is low, transistor 11 is conductive and transistor 10 is nonconductive. Output 17 is connected to VSS and therefore has a low value. When input 18 is high, transistor 11 is nonconductive and transistor 10 is conductive. Output 17 is connected to VDD and therefore has a high value.

With the input 18 in the high or low state, the output 17 is fairly stable. However, as the input 18 transitions from either high-to-low or low-to-high, there is a period in which both gates are partially on at the same time. Connection of VDD and VSS cause a drop in the potential difference between these reference potentials. The output driver load also possesses capacitive reactance which must be charged or discharged during transition, causing a current spike on VDD and VSS during charging or discharging of the output load capacitance. These voltage disruptions can cause circuit noise.

There is a finite and nonnegligible inductance L that exists between each gate 10 and 11 and the external power supply. The current spike through this parasitic inductance L results in a small dip in VDD and a small bounce in VSS at the gate. This effect is known as ground bounce. Ground bounce can cause noise which can propagate throughput a chip, resulting in an operator error. Some degree of noise can be reduced through the addition of decoupling capacitors across the power pins of integrated circuits. However, parasitic inductance continues to exist between the internal gates and the external decoupling capacitors. The effects of parasitic inductance responsible for switching noise cannot be completely removed by external decoupling capacitors.

The severity of ground bounce increases with the number of gates switching simultaneously. As bus widths get wider, this problem becomes more serious. The greater the number of simultaneously switched inputs, from high-to-low or low-to-high, the greater the severity of ground bounce.

Ground bounce results from the parasitic inductance of the IC and packaging interconnects. It can be especially troublesome in ICs that employ high speed transistors. During switching, when a transistor switches states, current is passed through these parasitic inductances at a changing rate. Change in current through an inductor produces a voltage across the inductor. The resultant current spike results in a bounce in the voltage source/drain of the transistor. This in turn changes the gate-to-source voltage of the transistor. This change in gate to source voltage is known as "ground bounce" in which the source or drain voltage falls above/below the nominal voltage for a period of time before recovering.

Source bounce and ground bounce both result from voltage spikes on the power network caused by logic transitions. There are adverse consequences of such voltage spikes. They reduce operating voltage which can delay or prevent circuit operation. Also, erroneous operation may occur because these voltage spikes may be transmitted through to the gate outputs. Noise can propagate throughout the part, resulting in an operating error. A typical high-speed CMOS chip will contain many such drivers that all share common on-chip power rails, e.g., nodes VDD and VSS. As bus width increases, this problem becomes more serious with the worst case scenario having all the bus drivers transitioning simultaneously from either high to low or low to high when a large spike is transmitted through to the outputs.

Ground bounce in actively switching circuits is recognized in the prior art. Methods are known for controlling ground bounce for channels that are actively switching their outputs, such as U.S. Pat. No. 4,933,574 to Lien et al., and for addressing the problem of quiescent channels that are already low and become unsettled by local ground bounce induced by a neighboring output channels, such as U.S. Pat. No. 5,319,260 to Wanlass. U.S. Pat. No. 5,124,579 to Nagshineh modifies the output drive with RC delay circuits to minimize ground bounce during active switching by including resistive means connected in series with certain gates of the pull-up and pull-down transistors, thereby limiting the rate of increase in voltages. Use of voltage feedback means to regulate voltage change rates is taught by U.S. Pat. No. 5,148,056 to Glass. These approaches require additional and complex circuitry and introduce switching delays. As bus widths increase, the number of additional components required by these approaches and the delays introduced may become unacceptable.

SUMMARY OF THE INVENTION

The present invention provides a dynamic current assist to the VDD and VSS power rails of an integrated circuit to reduce ground bounce by adding charge to VDD and drawing charge from VSS during the transition period of a gate. Two pairs of CMOS gates are added to dynamically connect the CMOS gate dynamically to a voltage potential above VDD and to a voltage potential below VSS as needed to assist in transitions from low-to-high and/or high-to-low. According to the present invention charge is dynamically added to the VDD node as it is needed and dynamically drawn from the VSS node as it is needed.

More specifically, the present invention provides a circuit for reducing bounce or switching noise in integrated circuits by adding two more pairs of CMOS gates in parallel with those in the original circuit such that the input of all three gates is tied to the same input signal. The VDD node of the original CMOS gate is connected to a voltage rail slightly above VDD (VDD+V), and the VSS node of the original gate is connected to a voltage rail slightly below VSS (VSS−V) through the two additional gates. In a circuit according to one embodiment of the present invention an instantaneous power assist is provided to a CMOS gate or driver by colocating on the device these two additional pairs of CMOS gates.

According to another embodiment of the present invention an enhancement of this instantaneous power assist is achieved by adding a resistance to the gate of one gate of the additional CMOS gate connected to the VDD node of the original CMOS gate and to one gate of the other additional CMOS gate connected to the VSS node of the original CMOS gate. The addition of these resistances will slightly delay the on/off times of these gates such that the one connected to the original VDD rail will pulse on sooner, causing an increased VDD when the gate input changes from low to high, and will pulse on slower when the input changes from high to low. Similarly, the other resistance will cause its associated gate connected to the original VSS rail to pulse on sooner when the input changes from high to low and to pulse on slower when the input changes from low to high.

The net effect is that when the output is transitioning from low to high, it will get an extra boost (VDD+V) from the CMOS gates added to the original VDD rail, while the added drain from VSS-V will be blocked by the CMOS gates connected to the original VSS rail. The converse is also true as the output transitions from high to low.

In yet another version of the current invention, the VDD+V and VSS-V power references may be generated by on-chip charge circuits, making the circuit self-contained.

Even though the VDD+V and VSS-V power rails suffer from the same parasitic inductance between the CMOS gate and the power supply, the fact that VDD+V is greater than VDD and that the gates are colocated on the device means that the power assist will be instantaneous and will be limited only by the inductance if the amount of the current drawn causes VDD+V to dip down to VDD (or VSS-V to bounce up to VSS).

The net result is that enhancement of CMOS gate operation will be significant in any of these embodiments of the current invention.

BRIEF DESCRIPTION OF THE DRAWINGS

For a better understanding of the nature of the present invention and its features and advantages, the subsequent detailed description is presented in connection with accompanying drawings in which:

FIG. 1 is an exemplary schematic diagram of a CMOS driver circuit according to the prior art;

FIG. 2 is an exemplary schematic diagram of an embodiment of a circuit for reducing ground bounce in a CMOS driver, according to the present invention;

FIG. 3 is an exemplary schematic diagram of an alternative embodiment of a circuit for reducing ground bounce in a CMOS driver, according to the present invention;

DETAILED DESCRIPTION OF PREFERRED EXEMPLARY EMBODIMENTS

Figure 4:
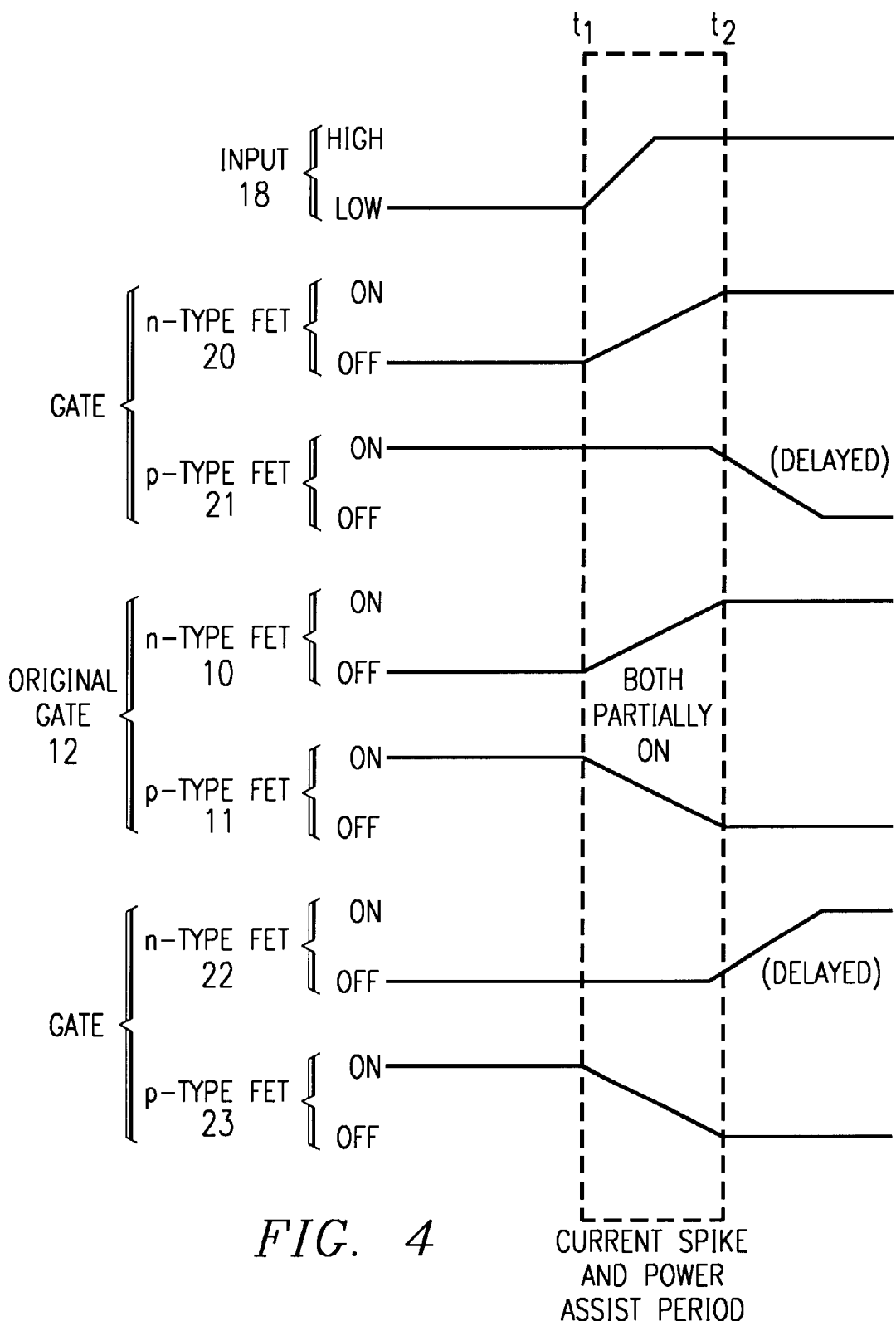
FIG. 4 is an exemplary timing diagram of the operation of the circuit illustrated in FIG. 2.

A conventional prior art CMOS transistor gate or driver is illustrated in FIG. 1. Multiple gates or drivers of this type may be incorporated, for example, as input and/or output buffers in an IC bus driver. The pull-up transistor element is provided by the n-type transistor 10 having a source coupled to VDD and a drain coupled to the circuit output 17. Pull-down p-type transistor 11 has a source coupled to VSS 13 and a drain coupled to the circuit output 18. Driver 16 is a noninverting output device so that output 17 transitions from high-to-low in sync with the transition of input 18 from high-to-low. During transition, this prior art CMOS driver can experience ground bounce reducing the switching efficiency of the driver.

A circuit according to an embodiment of the current invention, as illustrated in FIG. 2, which significantly reduces ground bounce adds two more pairs of CMOS drivers to the original drivers 10 and 11 of the circuit to compensate for bounce by providing dynamic power assists to the original CMOS driver as needed. The first pair of additional drivers 20 and 21 connect a voltage source VDD+V to the VDD source of the original pair of gates 10 and 11. The second pair of additional drivers 22 and 23 connect a voltage potential VSS-V to the VSS source of the original pair of gates 10 and 11. Voltage VDD+V is slightly above VDD and VSS-V is slightly below VSS.

One terminal of the first pair is connected to VDD+V and the second terminal 24 is connected to the VDD terminal of the original CMOS gate 12 and will provide a power assist to VDD of the original CMOS gate 12 when needed to overcome its VDD bounce. One terminal of the second CMOS driver pair is connected to VSS—V. The second terminal 26 is connected to VSS of the original CMOS gate 12 and will provide a power drain to VSS of the original CMOS gate 12 when needed to overcome its VSS bounce.

The gates of the first and second pairs of additional CMOS drivers are connected to the same input 18 as the original gate pair 10 and 11. These additional CMOS pairs will also have both gates partially on during transition of the input 18 between high and low states.

When input 18 is low, gate 11 connects output 17 to VSS. As input 18 transitions from low to high, gate 10 will switch on slightly before gate 11 switches off. Output 17 will be connected to VSS through gate 11 and to VDD through gate 10 for a period of time when both gates 11 and 10 are partially on. However, gates 20 and 21 will also be partially on during this period of time in the transition of input 18 from low to high. Therefore, VDD+V will also be connected to output 17 through gates 20, 21, and 10. The addition of VDD+V to VDD at the output 17 will reduce bounce on the VDD power rail.

When input 18 is high, gate 10 connects output 17 to VDD. As input 18 transitions from high to low, gate 11 will switch on slightly before gate 10 switches off. Output 17 will be connected to VDD through gate 10 and to VSS through gate 11 for a period of time when both gates 10 and 11 are partially on. However, gates 22 and 23 will also be partially on during this period of time in the transition of input 18 from high to low. Therefore, VSS-V will also be connected to output 17 through gates 23, 22, and 11. The addition of VSS-V to VSS at the output 17 will reduce ground bounce.

Because all gates 10, 11, 20, 21, 22, and 23 will transition at the same time, VSS-V and VDD+V will be added to output 17, reducing the bounce reduction of the embodiment of the present invention illustrated in FIG. 2. However, the enhancement to the original CMOS gate operation is significant even though the VDD+V and VSS-V power rails suffer from the same parasitic inductance from the CMOS gate out to the power supply. The fact that VDD+V is greater than VDD and VSS-V is lower than VSS and the gates are colocated on the devices means that the power assist will be instantaneous and will only be limited by the inductance if the amount of current drawn causes VDD+V to dip down to VDD or causes VSS-V to bounce up to VSS.

In an alternative embodiment, illustrated in FIG. 3, delay resistors R are added to the input of gates 21 and 22. This addition will slightly delay the on/off times of gates 21 and 22 such that the CMOS gate pair 20, 21 connected to VDD+V will pulse on sooner than CMOS gate pair 22, 23 when input 18 changes from low-to-high and will pulse on slower when input 18 changes from high-to-low. This means that when output 17 is transitioning from low-to-high, it will get an extra boost from VDD+V during the time that gates 10 and 11 are both partially on without suffering an added drain from VSS-V. As illustrated in FIG. 4, if the delay resistor is properly sized, gate 22 will not switch on until after gate 11 has switched off. Therefore, VSS-V will not be added to VSS during the transition time when both gates 10 and 11 are partially on.

The same is true for output 17 when transitioning from high-to-low. It will get an extra drain from VSS-V during the time that gates 10 and 11 are both partially on without suffering an added boost from VDD+V.

FIG. 4 illustrates the timing of the circuit of FIG. 3 when input 18 transitions from low to high. When input 18 begins its transition from low to high $t_1$, gates 11, 21, and 23 are on and gates 10, 20, and 22 are off. During the transition, gate 21 remains on and gate 22 remains off because resistors R delay the input voltage to these gates. Gates 10 and 20 switch on together during the transition and gates 11 and 23 switch off. At the end of the transition period $t_2$, gate 21 switches off and gate 22 switches on. Because gate 22 switches on only after gate 23 has switched off, VSS−V is never connected to output 17. Because gate 20 switched on while gate 21 remained on, VDD+V was connected to output 17 during the transition to reduce the noise from the connection of VDD with VSS.

When input 18 transitions from high-to-low, gate 22 will remain on during the transition and gate 21 will remain off because of the delay resistors R. VSS−V will be connected to output 17 while VDD+V will not, dampening any noise associated with the transition.

As one skilled in the art will recognize, generating separate VDD+V and VSS−V power rails for internal gates can increase chip complexity, especially for external bus drivers. Many alternatives are known in the art for generating differential reference voltages, including separate power supply inputs, on-chip charge circuits, voltage dividers, amplifiers, and the like, to generate appropriate voltages.

Because many varying and different embodiments may be made within the scope of the inventive concept taught herein, and because many modifications may be made in the embodiments detailed herein in accordance with the descriptive requirements of the law, it is to be understood that the details herein are to be interpreted as illustrative and not in a limiting sense.

What is claimed is:

1. A circuit for reducing switching noise in a high speed switch, comprising:
   an input for receiving data signals of high and low potential;
   an output for delivering data signals propagated through said switch;
   a first terminal having a first voltage;
   a second terminal having a second voltage;
   a primary gate for switching a current path between a first state connecting said first terminal with said output and a second state connecting said second terminal with said output, and having a control terminal connected to said input for controlling the conducting state of said current path;
   a second gate for connecting a third voltage to said first terminal and having a control terminal connected to said input for controlling the connection of said third voltage through said second gate; and
   a third gate for connecting a fourth voltage to said second terminal and having a control terminal connected to said input for controlling the connection of said fourth voltage through said third gate;
   wherein transition of said input from low to high data signals causes said second gate switches to momentarily connect said output to said third terminal; and
   the transition of said input from high to low data signals causes said third gate switches to momentarily connect said output to said fourth terminal; and
   said first state connects said first terminal to said output and said second state connects and second terminal to said output.

2. A circuit according to claim 1 wherein said gates are CMOS transistors.

3. A circuit for reducing switching noise in a high speed switch, comprising:
   an input for receiving data signals of high and low potential;
   an output for delivering data signals propagated through said switch;
   a first terminal having a first voltage;
   a second terminal having a second voltage;
   a primary gate for switching a current path between a first state connecting said first terminal with said output and a second state connecting said second terminal with said output, and having a control terminal connected to said input for controlling the conducting state of said current path;
   a second gate for connecting a third voltage to said first terminal and having a control terminal connected to said input for controlling the connection of said third voltage through said second gate; and
   a third gate for connecting a fourth voltage to said second terminal and having a control terminal connected to said input for controlling the connection of said fourth voltage through said third gate;
   wherein transition of said input between said high and low data signals causes said primary gate to switch between said first and second states and causes said second and third gates to connect said respective third and fourth voltages to said respective first and second terminals for a finite period of time;
   first delay means operatively coupled to said second gate to delay said connection of said third voltage to said first terminal; and
   second delay means operatively coupled to said third gate to delay said connection of said fourth voltage to said second terminal.

4. A circuit according to claim 3 wherein: said third and fourth voltages are generated by on-chip circuits.

5. A circuit according to claim 3 wherein said delay means includes a resistor.

6. A data driver comprising:
   a primary CMOS gate having an input, a first voltage source VDD and a second voltage source VSS, and an output;
   a second CMOS gate having an input connected to said primary CMOS gate input and having a first terminal connected to a voltage source above VDD and a second terminal connected to VDD;
   a third CMOS gate having an input connected to said primary CMOS gate input and having a first terminal connected to a voltage source below VSS and a second terminal connected to VSS.

7. A data driver according to claim 6, wherein:
   said input transitions between high and low input states,
   said first and second voltages sources are alternatively by said primary gate dependant upon said state of said input;
   said voltage source above VDD connects to said output when said input is transitioning from low to high;
   said voltage source below VSS connects to said when said input is transitioning from high to low; and
   said primary CMOS gate connects said first and second voltages simultaneously to said output when said input is between said high and low input states.

8. A data driver according to claim 7 further comprising:
   first delay means operatively coupled to said second CMOS gate to delay said connection of said voltage source above VDD to said output while said input transitions from said high state to said low state; and second delay means operatively coupled to said third CMOS gate to delay said connection of said voltage source below VSS to said output while said input transitions from said low state to said high state.

9. A data driver according to claim 7 further comprising:

first delay means operatively coupled to said second CMOS gate to prevent said connection of said voltage source above VDD to said output while said input transitions from said high state to said low state; and second delay means operatively coupled to said third CMOS gate to prevent said connection of said voltage source below VSS to said output while said input transitions from said low state to said high state.

10. A circuit according to claim 8 wherein said delay means includes a resistor.

11. A circuit according to claim 6 wherein said gates are CMOS transistors.

* * * * *